(12) United States Patent
Scholer et al.

(10) Patent No.: US 7,586,722 B2
(45) Date of Patent: Sep. 8, 2009

(54) HIGH VOLTAGE INTERLOCK SYSTEM AND CONTROL STRATEGY

(75) Inventors: Rich Allen Scholer, Farmington Hills, MI (US); Brian D. Rutkowski, Ypsilanti, MI (US); Hasdi R Hashim, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 170 days.

(21) Appl. No.: 11/856,941

(22) Filed: Sep. 18, 2007

(65) Prior Publication Data

US 2009/0073624 A1 Mar. 19, 2009

(51) Int. Cl.
H02H 5/04 (2006.01)
(52) U.S. Cl. .......................... 361/88; 361/23
(58) Field of Classification Search ............ 361/21, 361/23, 88; 307/9.1, 10.1, 10.5
See application file for complete search history.

(56) References Cited

U.S. PATENT DOCUMENTS

| | | |
|---|---|---|
| RE28,822 E | 5/1976 | Fritts |
| 5,281,857 A | 1/1994 | Keese |
| 5,537,283 A | 7/1996 | Keese |
| 7,084,361 B1 | 8/2006 | Bowes et al. |
| 7,508,097 B2 * | 3/2009 | Furuta et al. ............. 307/328 |
| 2005/0032404 A1 | 2/2005 | Furuta et al. |

* cited by examiner

Primary Examiner—Danny Nguyen
(74) Attorney, Agent, or Firm—David Kelley, Esq.; Tung & Associates

(57) ABSTRACT

A High Voltage Interlock Loop (HVIL) system and Control Strategy is provided for an alternative fuel vehicle including an electric, a hybrid electric, or a fuel cell vehicle. Generally, the HVIL system having associated logic including an HVIL circuit is provided to allow the vehicle to operate in either a high voltage (HV) or power mode powered by a power source or a HVIL interrupt mode based on an operational state of the HVIL system. When HVIL circuit fails shorted high, low or open, a Diagnostic Trouble Code (DTC) is set and the Service Soon Lamp is illuminated to indicate to a service technician that additional safety precautions need to be taken when servicing the HV system. The HV contactors may or may not be activated providing HV to the vehicle when HV is not expected to be present at connectors and HV devices.

16 Claims, 2 Drawing Sheets

HIGH VOLTAGE INTERLOCK SYSTEM AND CONTROL STRATEGY

FIELD OF THE INVENTION

The present invention generally relates to a high-voltage interlock and relates more specifically to a high-voltage interlock having a monitoring system.

BACKGROUND OF THE INVENTION

Modern vehicles often include many high-voltage electrical devices. High voltage devices may present challenges not present in conventional lower voltage systems. In the event of a vehicle accident or vehicle component failure, a short-circuited high voltage system may sustain heavy damage because of the relatively high voltage levels. Another concern is undesired contact with high voltage levels, either directly or indirectly, by a vehicle user or other persons.

Existing high voltage interlocks do provide a degree of safety for users anticipating contact with a high voltage electrical system, such as maintenance personnel, but may not provide protection in situations where a user inadvertently contacts a high voltage electrical system.

While existing devices suit their intended purposes, what is needed is a system that allows monitoring the High Voltage Interlock Loop (HVIL) with respect to wiring failures. This allows alerting the service personnel of a wiring failure system that needs additional precautions prior to servicing the high voltage system.

SUMMARY

A High Voltage Interlock Loop (HVIL) system and Control Strategy is provided for an alternative fuel vehicle such as an electric, a hybrid electric, or a fuel cell vehicle. Generally, the HVIL system having associated logic including an HVIL circuit is provided to allow the vehicle to operate in either a high voltage (HV) or power mode powered by a power source or a HVIL interrupt mode based on an operational state of the HVIL system.

BRIEF DESCRIPTION OF THE DRAWINGS

These and other objects, features and advantages of the present invention will become apparent from the following detailed description and the appended drawings in which.

DETAILED DESCRIPTION OF THE INVENTION

Figure 1:
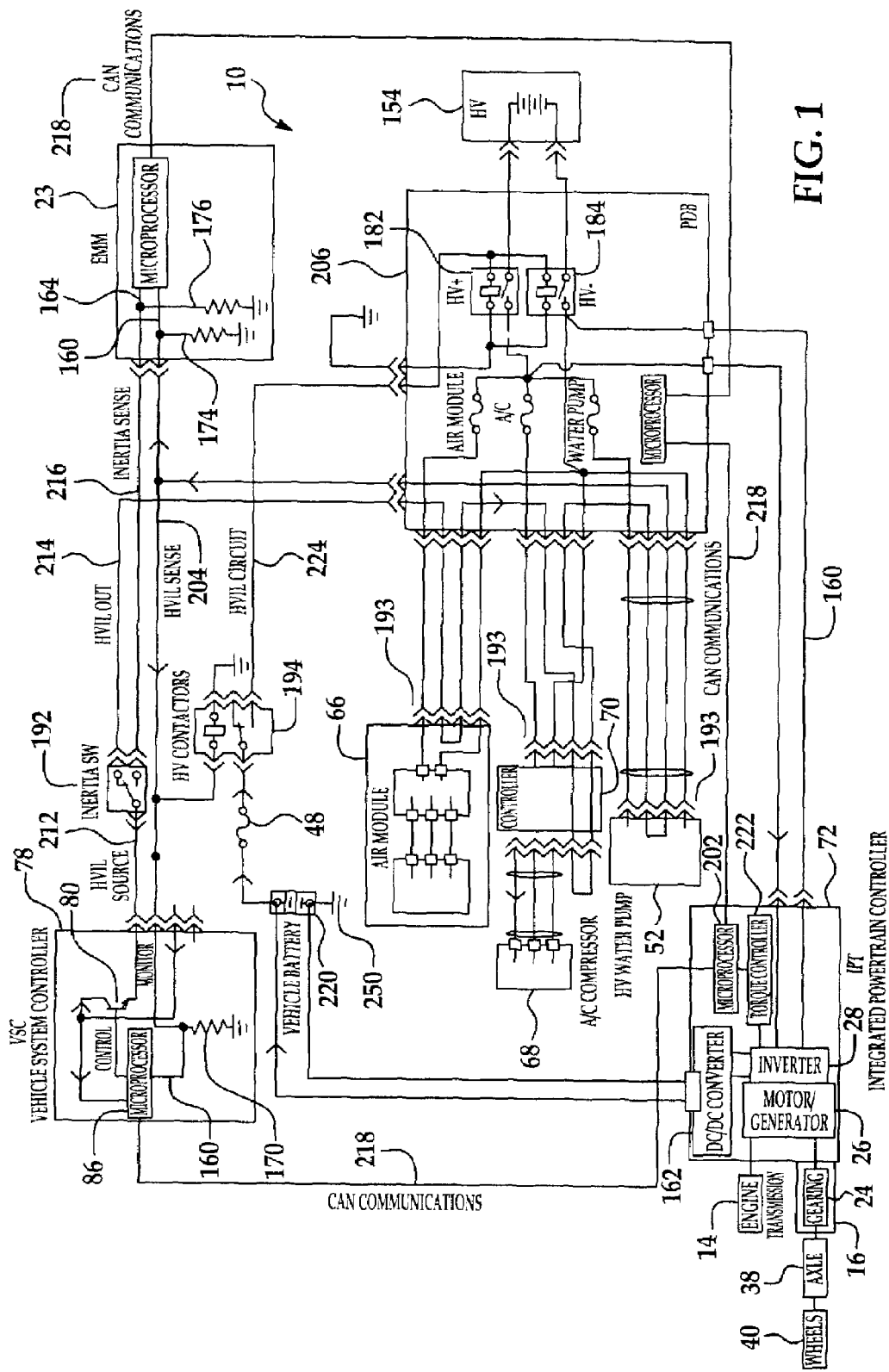
FIG. 1 illustrates a HVIL monitor and control strategy in accordance with one embodiment of the invention.

FIG. 1 illustrates an exemplary fuel cell vehicle and includes the HVIL control system 10 and strategy in accordance with one embodiment of the present invention.

The present invention can be used, however, with any hybrid electric systems without deviating from the scope of the present invention, including vehicles powered by internal combustion engines, series hybrid electric vehicles (SHEV), parallel hybrid electric vehicles (PHEV), and electric vehicles that use a high voltage power source in combination with a vehicle battery. FIG. 1 illustrates an electrical diagram of the HVIL control system in accordance with one embodiment of the invention.

Exemplary fuel cell vehicle 10 includes electrically operated or controlled components including fuel cell 154, transmission 16, and vehicle battery 220. These components operate with a planetary gear set 24 in the transmission, a motor/generator 26, an inverter 28 within the IPT 72, that powers a differential axle 38 (at the output of the transmission) and the vehicle wheels 40. The IPT 72 controls and monitors the torque output of engine 14 and motor/generator 26. Fuel cell 154, transmission 16, and VSC 78 cooperate to form a system for the vehicle 10, as is shown and discussed in further detail in FIG. 1.

Vehicle system controller 78 (VSC) controls all aspect of vehicle operation. VSC 78 monitors vehicle operation and controls vehicle 10. VSC 78 generates and transmits signals to the vehicle components. The components operate as instructed by VSC 78. VSC 78 may control each component independently and collectively to control vehicle operation.

In one embodiment of the invention, vehicle 10 includes HVIL monitor and control module microprocessor 86. HVIL monitor and control module microprocessor 86 provides HVIL control logic through an inertia switch 192, a plurality of HV accessory connectors 193, and a HV contactors relay 194 to one or more HV contactors 182, 184.

In the embodiment of the invention illustrated in FIG. 1, the HVIL control system 10 includes two HV contactors 182, 184. In other embodiments of the invention, one or more HV contactors may be included.

In one embodiment of the invention, illustrated in FIG. 1 the control module 86 and associated control logic may reside within the VSC 78.

In one embodiment of the invention, the HVIL module 86 may be in operative communication with the VSC 78 but may reside in a separate location from the VSC 78.

In an embodiment of the invention, VSC 78 includes an associated HVIL activation switch 80, the HVIL activation switch 80 in signal communication with the VSC 78 and adapted to selectively couple or decouple a vehicle battery 220 from the VSC 78. The high voltage interlock system logic is in electrical communication with a vehicle system controller (VSC) and may be integrally formed as a sub-module within the VSC.

Signals from a HVIL 212 source signal are input into the inertia switch 192. The HVIL source 212 becomes the HVIL Out 214 continuing on to the power distribution box 206 and components associated therewith when an inertia switch 192 is closed or not triggered. The HVIL Out 214 is then input into the HV connectors 193 and becomes the HVIL sense signal 204 when monitoring for breaks in the HVIL source 212 and the HVIL sense signal 204. The HVIL source 212 and HVIL sense signal 204 are the same signal when the inertia switch 192 is closed and when the HV connectors 193 are mated with the activated HV contactors relay 194, and thus cooperate to form HVIL circuit 224 that provides vehicle battery 220 power to the HV contactors 182, 184. VSC 78 can control operation of power sensed and distributed within the vehicle 10 based on the operation of the HVIL circuit.

FIG. 1 illustrates an exemplary fuel cell vehicle 10. Fuel cell vehicles include components similar to those to be described below with respect to vehicles having internal combustion engines.

The fuel cell vehicle 10 illustrated in FIG. 1 includes fuel cell 154 and a traction motor/generator 26. Fuel cell 154 replaces a conventional engine, but it is similarly controlled by VSC 78. The traction motor/generator 26, powered by inverter 28 and gearing 24 is controlled by VSC 78. Inverter 28 and motor/generator 26 operate on power provided from the high voltage bus 160. High voltage bus 160 receives power from Fuel Cell 154. DC/DC converter 162 receives power inputs from HV power bus 160, and supplies 12V to the vehicle low voltage electrical system and recharges the 12V battery 220. Fuel cell 154 further includes air conditioning compressor 68 and associated controller 70, air module 66 and HV water pump 52.

FIG. 1 illustrates a high voltage interlock control system 10 and strategy for use in a vehicle having a HVIL module 86 in accordance with one embodiment of the invention.

The HVIL control system 10 includes a VCS 78 in signal communication with a plurality of signal lines including a HVIL source line 212 output from the VCS 78 to an HVIL out line 214 when inertia switch 192 is closed and an inertia sense line 216 in further communication with an Energy Management Module (EMM) 23 when the inertia switch 192 is tripped, and a HVIL sense line 204 in further signal communication with a HV contactors controller relay 194, power distribution box 206 (PDB), and using the CAN network protocol 218 is in further operative communication with an IPT interface 202, a torque controller 222, and other vehicle systems.

The VSC 78 provides a source for the HVIL circuit 224 and operates to control the HVIL system and monitor for nonconforming HVIL operating conditions.

In an embodiment of the invention, the HVIL circuit 224 is in further operative communication with an Energy Management Module 23 that monitors for high voltage battery readings, wherein for the HV power supply 154 to power the modules in signal communication with the PDB 206, the HVIL sense line 204 input must be high and the inertia sense line 216 must be low.

In another embodiment of the invention, if the VSC 78 uses power from the vehicle battery 220, the VSC 78 may not need to monitor the HVIL circuit 224 for HV battery readiness, and wherein the EMM 23 reads the inertia sense line 216 input.

The PDB 206 control communications between the VSC 78, the IPT interface 202, an auxiliary battery 220, and a power supply 154 via a HV bus 160 in communication 218 with a plurality of modules including an air module 66, an A/C compressor 68, and a HV water pump 54.

Operation of the HVIL 10 control system depends upon a HV contactors controller 194, shown in FIG. 1 as a relay operating as a switch, shown in FIG. 1 as not activated, whereas the HV contactors 182, 184 are not triggered or opened, thereby suppressing power from the HV bus 160 to selected vehicle systems or components. As the HV contactors controller relay 194 is activated by the HVIL Sense 204 circuit, the HV contactors 182, 184 are closed in a normal vehicle operation mode, the HV power supply 154 then provides power to the selected vehicle components 54, 66, 68 as disclosed herein and as shown in FIG. 1 when the HV contactors 182, 184 are triggered or closed. The HV contactors 182, 184 are normally open relays operating as single pole single throw switches as shown in FIG. 1.

The inertia switch 192 is provided in communication with the VCS 78 and the EMM 23. The inertia switch 192 trips when an inertia event occurs, thereby forming a connection between the HVIL source line 212 and an inertia sense line 216. The inertia switch 192 operates in an opposite switching state from the switching state of the HV controller 194, when the inertia switch 192 trips, the inertia sense line 216 communicates a second digital input 164 into the EMM 23, wherein the second digital input 164 has an associated second pull-down resistor 176 that is input into the EMM 23 and toggles between a high or a low/open state depending upon the operating mode of the HVIL circuit 224, and in particular, the state of the inertia sense line 216.

In the embodiment of the invention illustrated in FIG. 1, IPT 72 includes associated IPT microprocessor 202, the IPT microprocessor 202 in signal communication with the VSC 78.

A first digital input 160 has an associated pull-down resistor 170 input into the VSC 78 and EMM 23 and is connected to the HVIL sense line 204 that toggles between a high or a low/open state depending upon the operating mode of the HVIL circuit 224, and in particular, the state of the HVIL inertia sense line 204.

The HVIL circuit 224 powers the HV Contactors 182, 184 in accordance with commands received from the VSC 78.

The HVIL circuit 224 includes the HVIL source line 212 that is enabled by the VSC 78 and that powers the HV contactors 182, 184 to close until an HV contactor open event occurs; an HVIL sense line 204 that is at the same potential as the HVIL source line 212 if the inertia sense switch 192 is not tripped, or closed if the HVIL sense circuit 204 is not broken; an inertia sense line 216 that is at the same potential as the HVIL source line 212 output from the VSC 78 if the inertia sense switch 192 is tripped or closed. The VSC 78 is in signal communication with a CAN system 218 for vehicle communications and provides a protocol check for the HVIL control system 10. The HVIL circuit 224 includes the HVIL source line 212 as an output from the VSC 78 into a plurality of HVIL related modules including an air module 66, an A/C compressor 68, an associated A/C compressor controller 70, and a HV water pump 52; and the HVIL sense line 204 as an output from the plurality of HVIL related modules into both the VSC 78 and an HV contactors controller relay 194.

The HVIL out line 214 is at the same potential as the HVIL source line 212 if the inertia switch 192 is not tripped, however, the HVIL out line 214 is not monitored by the HVIL control system 10.

Figures 2, 3:
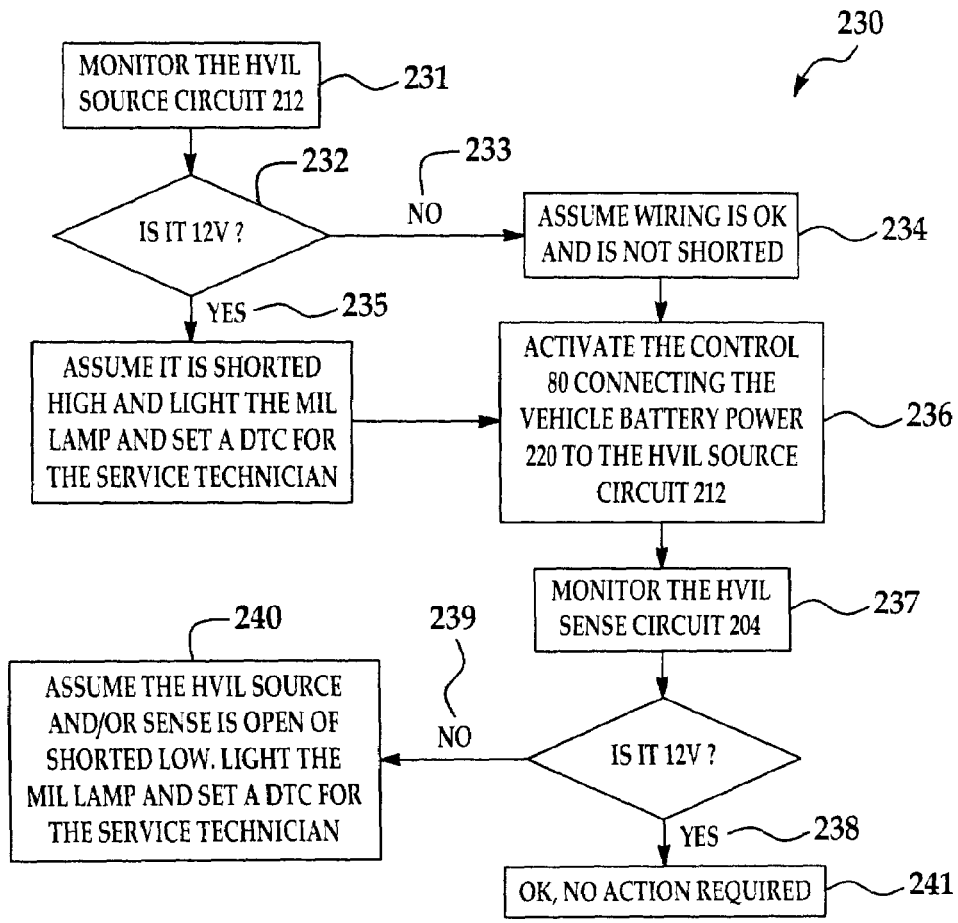
FIG. 2 illustrates a table illustrating monitoring strategies in accordance with one embodiment of the invention.
FIG. 3 illustrates a HVIL control strategy in accordance with one embodiment of the invention.

FIG. 3 illustrates a flowchart of a HVIL control strategy and method 230 using the HVIL control system 10 to perform a plurality of options based upon a particular vehicle operation mode.

Initially, the HVIL source 212 is monitored by the VSC 78, control module microprocessor 86 prior to activating the HVIL activation switch 80 (231), for a short to 12V (232). If the HVIL source 212 is low (233), then the HVIL Source is assumed not shorted high (234) and is ready for activation. If the HVIL source 212 is high (235), then the HVIL source 212 is assumed shorted and a DTC is set. The HVIL activation switch 80 is then activated (236) and the vehicle can be operated.

In an embodiment of the invention, the HVIL sense 204 is then monitored (237). If the HVIL sense line 204 input is low (239), then the HVIL source 212 and/or HVIL sense 204 is either open or shorted low, wherein a DTC is also set (240). If the HVIL sense line 204 input is high (238), the system is OK and no action is required (241).

In an embodiment of the invention, when the VSC 78 senses a low input from the HVIL sense line 204, then one of four events has occurred, indicating an event selected from: an HVIL open circuit, a local open circuit, a tripped inertia switch, or a short to ground.

If an HVIL open circuit is detected, then the HV contactors 182, 184 are opened and thus, the HV bus 160 is suppressed from the fuel cell 154. The VCS 78 confirms HV operational status from the CAN 218.

If a local open circuit is detected, then the HV contactors 182, 184 could be open or closed and the potential of the HV bus 160 is high, exists.

The VCS 78 checks the HVIL circuit 224 operational status from the CAN 218. Additionally, the status of other modules within the vehicle may be checked from the CAN including, but not limited to: HVIL sense line 204 and inertia sense line 216.

In another embodiment of the invention, the EMM 23 reads inputs from the inertia switch 192, and determines if the inertia switch 192 is tripped or closed.

In another embodiment of the invention, the VCS 78 determines if a short to ground in HVIL source line 212 of the HVIL circuit 224 exists when the vehicle is being driven. A fuse 48 associated with the HV contactors controller 194 may be blown if a short to ground exists and thus, the HV contactors 182, 184 will open, thereby decoupling the 12V battery 220 from the HVIL circuit 224.

The HVIL sense signal 204 is a logic signal inputting either a high or a low input into the VCS 78 from the HVIL sense line 204 or indirectly from the HVIL circuit 224, wherein the HVIL sense signal 204 provides control to the HV contactors relay 194 that provides power the HV contactors 182, 184. The HV contacts 182, 184 will not be powered by the auxiliary battery 220 when the HVIL circuit 224 is broken.

FIG. 2 illustrates a logic table 300 indicating operating states of the vehicle and in particular the HVIL control system 10.

A logic table shown in FIG. 2 illustrates states of monitoring the HVIL Source 212 before and after the HVIL activation switch 80 is applied. This indicates whether the HVIL Source 212 is shorted to 12V. Upon activation of the HVIL activation switch 80, the HVIL Sense 204 is monitored using the first digital input 160 associated with the HVIL sense line 204 input into the VSC 78. The level of the HVIL Sense 204 with respect to the HVIL Source 212 indicates possible failure conditions to the HVIL circuit.

What is claimed is:

1. A high voltage interlock loop (HVIL) control system for an alternative fuel vehicle comprising:
    a HVIL circuit including
        a vehicle system controller (VSC) having a HVIL controller in signal communication with a HVIL source line output from the VSC;
        an inertia switch in signal communication with the HVIL source line and with an associated inertia sense line, and with a HVIL sense line;
        the HVIL sense line in communication with the VSC, with the HVIL source line and with a HV contactors controller when the HV contactors controller is activated, wherein the HVIL circuit is powered by a vehicle battery that activates the HVIL Circuit to allow the vehicle to operate in either a high voltage (HV) power mode powered by a HV power source or a HVIL interrupt mode based on an operational state of the HVIL circuit.

2. The HVIL control system of claim 1, wherein the VSC controls operation of power sensed and distributed within the vehicle based on operation of the HVIL circuit.

3. The HVIL control system of claim 1, further comprising: a fuel cell vehicle.

4. The HVIL control system of claim 1, further comprising:
    a pair of HV contactors;
    the HV power source that powers an associated HV bus when both the HV contactors are closed;
    the HV contactors controller that controls operation of both the HV contactors and that when triggered is in signal communication with the HVIL sense line when and that when triggered is in signal communication with a HVIL interrupt line;
    the HVIL interrupt line that suppresses high voltage (HV) communicated from the HV bus to selected vehicle systems or components when the HV contactors controller is triggered.

5. The HVIL control system of claim 4, wherein the HV contactors comprise normally open relays operating as single pole single throw switches.

6. The HVIL control system of claim 5, wherein when the HV contactors are opened, power is suppressed from the HV bus to selected vehicle systems and components, and wherein when the HV contactors are closed, the vehicle operates in a normal vehicle operation mode.

7. The HVIL control system of claim 4, wherein the two HV contactors are normally open relays that are closed when operating in a normal vehicle operation mode and open when operating in an HVIL interrupt mode.

8. The HVIL control system of claim 1, further comprising:
    an Energy Management Module (EMM) interface in signal communications with the inertia sense line when the inertia switch is triggered by an inertia event;
    a power distribution box (PDB) in signal communication with the HV power source, with an Integrated Power-Train interface, with a plurality of selected vehicle components powered by the HV bus; and
    an auxiliary battery that powers both the HV contactors when the HV contactors controller is triggered.

9. The HVIL control system of claim 8, wherein the PDB controls communications between the VSC, the IPT interface, the auxiliary battery, and the HV power source via the HV bus in communication with a plurality of modules including an air module, an A/C compressor, and a HV water pump.

10. The HVIL control system of claim 8, further comprising:
    a first digital input associated with the HVIL sense line that toggles between a low or a high state and is in signal communication with the VSC interface; and
    a second digital input associated with the inertia sense line that toggles between a low or a high state corresponding to an operational state of the inertia switch, wherein the second digital input is in signal communication with the EMM interface.

11. The HVIL control system of claim 1, further comprising:
    a plurality of modules in signal communication with and powered by the HV power supply when the HVIL circuit is operating in a normal HV vehicle mode, wherein the plurality of modules includes an air module, an A/C compressor module, an A/C compressor controller module, and a HV water pump.

12. A high voltage interlock loop (HVIL) control system for an alternative fuel vehicle comprising:
    a HVIL circuit including
        a vehicle system controller (VSC) having a HVIL controller in signal communication with a HVIL source line output from the VSC;
        an inertia switch in signal communication with the HVIL source line and with an associated inertia sense line, and with a HVIL sense line;
        the HVIL sense line in communication with the VSC, with HVIL source line and with a HV contactors controller that controls operation of a pair of HV contactors, wherein the HVIL circuit is powered by a vehicle battery that activates the HVIL Circuit to allow the vehicle to operate in either a high voltage (HV) power mode powered by a HV power source when the HVIL contactors are closed or a HVIL interrupt mode when the HV contactors are opened based on an operational state of the HVIL circuit.

13. A high voltage interlock loop control and monitoring method for an HVIL control system including a high voltage (HV) circuit, the HV circuit including a HV power source that powers a plurality of vehicle components via a HV bus unless a HVIL interrupt event occurs, a vehicle system controller (VSC) in signal communication with a vehicle Instrument Cluster that includes a Service Soon Lamp when power to the HV bus is interrupted, the method comprising:

setting a diagnostic trouble code (DTC) and illuminating the Service Soon Lamp when a predefined condition occurs within the HVIL circuit.

14. The HVIL control method of claim 13, further comprising:

determining if the HV circuit is activated;

monitoring the HVIL Source circuit for a short to a vehicle battery before activation;

indicating a short to 12V if the HVIL Source input is high;

activating the HVIL circuit applying power from the vehicle battery to a HVIL source line;

monitoring the HVIL Sense line if the HVIL sense line input into the VSC is low when the HVIL circuit is activated;

indicating a short to ground or open if the HVIL sense line input into the VSC is low;

monitoring the HVIL sense line for an open or a short circuit when power from the vehicle battery is applied to the HVIL sense line; and determining a HVIL control operation based on an HVIL operating condition.

15. The HVIL control and monitoring method of claim 14, further comprising:

indicating an event selected from a HVIL open circuit, a local open circuit, a tripped inertia switch, or a short to ground if the VSC senses a low input from the HVIL sense line.

16. The HVIL control method of claim 14, further comprising:

operating the vehicle in a normal HV operation if a first digital input associated with the HVIL sense line is high and a second digital input associated with an inertia sense line is low;

setting the DTC and illuminating the Instrument Cluster Service Soon Lamp associated with a HVIL source line if the HVIL source line is high and if the first digital input associated with the HVIL sense line is low, or if the first digital input is low, and if the second digital input is high;

checking HV status from a Control Area Network system if a local open circuit exists; and sensing a short to ground on a HVIL interrupt circuit if the first digital input is low, at least one of HV contactors is not closed and the second digital input is low.

* * * * *